(12) United States Patent
Soldano

(10) Patent No.: US 7,276,883 B2
(45) Date of Patent: Oct. 2, 2007

(54) SELF-DRIVEN SYNCHRONOUS RECTIFIED BOOST CONVERTER WITH INRUSH CURRENT PROTECTION USING BIDIRECTIONAL NORMALLY ON DEVICE

(75) Inventor: Marco Soldano, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/202,134

(22) Filed: Aug. 11, 2005

(65) Prior Publication Data

US 2006/0033480 A1    Feb. 16, 2006

Related U.S. Application Data

(60) Provisional application No. 60/600,914, filed on Aug. 12, 2004.

(51) Int. Cl.
G05F 1/565 (2006.01)
G05F 1/56 (2006.01)

(52) U.S. Cl. .................. 323/222; 323/224; 323/908

(58) Field of Classification Search ............ 323/222, 323/225, 266, 282, 284, 285, 908, 224; 361/18, 361/93.9

See application file for complete search history.

(56) References Cited

U.S. PATENT DOCUMENTS

| | | | | | |
|---|---|---|---|---|---|
| 4,546,401 | A | * | 10/1985 | Svedberg | .................. 361/91.8 |
| 5,994,882 | A | * | 11/1999 | Ma | ........................... 323/222 |
| 6,862,201 | B2 | * | 3/2005 | Hodge, Jr. | .................. 363/89 |

* cited by examiner

*Primary Examiner*—Gary L Laxton
(74) *Attorney, Agent, or Firm*—Ostrolenk, Faber, Gerb & Soffen, LLP

(57) ABSTRACT

A boost converter in which the conventional boost diode is replaced by a bidirectional normally conducting semiconductor switch. The circuit may be implemented so the bidirectional switch is self-driven by connecting a low voltage Schottky diode between a first gate-source terminal pair. An inrush current protection function may be provided by utilizing a second gate-source terminal pair to turn the switch on and off independent of the self-driven operation in response to predetermined excessive load current conditions. The inrush current protection function is implemented by use of a second Schottky diode connected between the second gate and source terminals, and an RC circuit connecting the second gate terminal to the return rail for the converter power output transistor with an externally controlled switch connected to the RC circuit to control the bias according to the load current.

18 Claims, 2 Drawing Sheets

SELF-DRIVEN SYNCHRONOUS RECTIFIED BOOST CONVERTER WITH INRUSH CURRENT PROTECTION USING BIDIRECTIONAL NORMALLY ON DEVICE

CROSS-REFERENCE TO RELATED APPLICATIONS

This application is based on and claims priority to U.S. Provisional Application 60/600,914, filed Aug. 12, 2004, the entire disclosure of which is incorporated herein by reference.

BACKGROUND OF THE INVENTION

1. Technical Field of the Invention

The present invention relates to synchronous rectifier boost converters, and more particularly to such devices in which the conventional boost diode is replaced by a bidirectional semiconductor switches are used 2. Relevant Art Power factor correction (PFC) is required by international standards (EN61000-3-2) to reduce harmonic emissions in AC powered systems. The most common conventional solution employs an input rectifier bridge, followed by a boost switching converter, controlled by a voltage and a current loop. FIG. 1 shows a typical PFC rectifier stage, generally designated 10, including an input circuit 12, a diode bridge rectifier 14 feeding a MOSFET 16 through a boost choke 18, and a boost diode 20 which provides the output power through a capacitor 22. The load circuit, shown schematically as a resistor 24, is connected across capacitor 22.

Gate control for MOSFET 16, and PFC are provided by a suitable logic circuit 26. With this circuit, the voltage and current at the converter input 12 will be proportional at all times, generating the desired resistive behavior at the input of the system.

There are typically two problems that arise in boost topology configurations, namely high reverse recovery losses, and control of inrush current at startup. As to the first problem, when MOSFET 16 turns on during normal operation, the reverse recovery charge of boost diode 20 causes significant switching losses, seriously limiting the maximum switching frequency.

The second problem typically occurs at system startup, when the output capacitor 22 is discharged: the output capacitor is charged by the rectified AC line. The amplitude of the charging current is limited by the impedance of the input loop, resulting in a significant inrush current that can cause component failures.

In conventional topologies, there is no controllable switch in the path of the charging current by which the current path can be shut down if necessary. Conventional solutions for this problem take the form of negative temperature coefficient (NTC) or standard resistors with relays, SCR's, as illustrated on the input side of rectifier bridge in FIG. 1.

Specific conventional implementations of PFC in boost converters may be found in the following U.S. patents: U.S. Pat. No. 6,285,170 B1 to Matsumoto et al. for SWITCHING POWER SUPPLY; U.S. Pat. No. 5,420,780 to Bernstein et al. for APPARATUS FOR LIMITING INRUSH CURRENT; U.S. Pat. No. 5,994,882 to Ma for SYNCHRONOUS RECTIFIER FOR BOOST CONVERTERS. In all of these, however, the solutions address only one of the two main issues (inrush and reverse recovery losses) and they all use additional components which can not conveniently be fabricated as part of the converter IC. Clearly, a need exists for a better solution which addresses both problems, and also allows convenient integration.

SUMMARY OF THE INVENTION

The present invention seeks to satisfy the above-noted needs by substituting a bidirectional normally conducting semiconductor switch for the boost diode shown in FIG. 1. This known device is capable of conducting and blocking current in both directions, and is sometimes referred to as a four quadrants switch, because it is a device capable of conducting current and blocking voltage in both directions, and thus is capable of working in the four quadrants of the VI plane. A schematic diagram of such a device, generally denoted at 32, is shown in FIG. 2.

Here, the bidirectional current path is between a first source terminal 34 and a second source terminal 36. Control is provided by bias voltages provided by a first voltage source 38 connected between a first gate terminal 40 and source terminal 34 and a second voltage source 42 connected between a second gate terminal 44 and source terminal 36. A device of this kind is characterized by the fact that when a negative bias is applied across either one or both of the gate-source pairs, the device will be off. Only if the voltage at both gates is zero, can current flow between the two source terminals.

According to a first aspect of the invention, both a synchronous rectification function and a current inrush limiting function are implemented in a boost converter using a single bidirectional normally on switch. Preferably, according to this aspect of the invention, the boost converter employs a self-driven topology. Advantageously, the bidirectional switch and associated circuitry will be part of the IC which implements the boost converter itself.

According to a second aspect of the invention, a self-driven boost converter with inrush current limiting protection is implemented by replacing the conventional boost diode with a normally on bidirectional semiconductor switch having a low voltage Schottky diode connected between the gate and source terminals of the line-side pair.

According to a third aspect of the invention, inrush current limiting protection is implemented in a boost converter by replacing the conventional boost diode with a normally on bidirectional semiconductor switch using one (preferably) the load-side gate to turn off the bidirectional switch under control of a suitable logic circuit when the load current reaches dangerous levels. Both short circuit and overload protection can be provided in this manner.

Further according to the third aspect of the invention, there may be provided a low voltage Schottky diode connected between one of the gate and source terminal pairs of the bidirectional switch, preferably the line-side pair, with a second Schottky diode connecting the load-side gate terminal to a circuit protection logic circuit.

Circuits according to the various aspects of the invention require minimal addition of extra components, making the device economical and easily implemented as an IC with the rest of boost converter. Functional improvements over conventional practice are also obtained. For the synchronous rectification function, only the small forward voltage of the low voltage Schottky diode (0.2-0.3V) and the $R_{DSon}$ loss of the switch contribute to conduction losses, making the circuit very efficient. This represents an advantage even compared to the most advanced wide bandgap rectifier diodes (SiC and GaAs) which exhibit high conduction losses. Also, there are no reverse recovery losses, but only capacitive discharge of the switch capacitance.

For the inrush current limiting function, an important advantage is that the current path can be opened at any given time, providing a solid state fuse function. A complete and accurate inrush current control is therefore possible.

Other features and advantages of the present invention will become apparent from the following description of the invention which refers to the accompanying drawings.

BRIEF DESCRIPTION OF THE DRAWING(S)

Throughout the drawings, like parts are designated by the same reference number.

DETAILED DESCRIPTION OF PREFERRED EMBODIMENTS OF THE INVENTION

Figure 1:
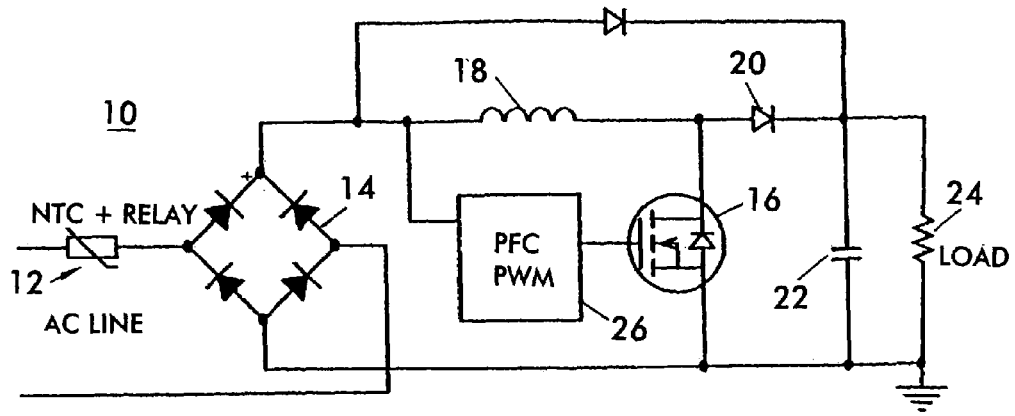
FIG. 1 is a schematic circuit diagram of a typical PFC rectifier stage having boost converter topology.
Figure 2:
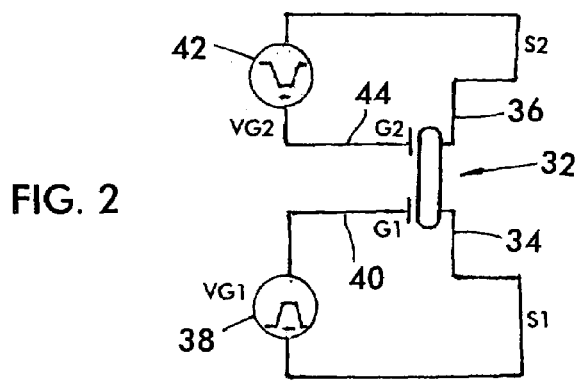
FIG. 2 is a schematic diagram representing the functionality of a bidirectional normally on switch.
Figure 3:
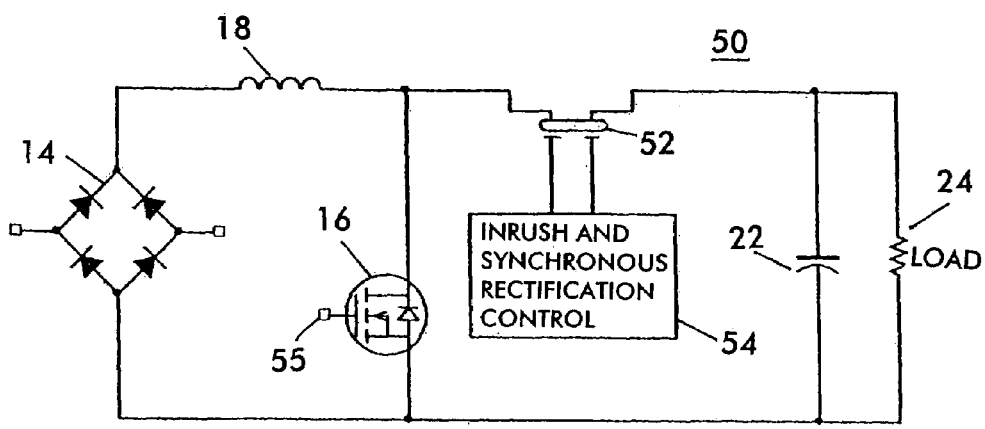
FIG. 3 is a simplified schematic representation of a synchronous boost converter having inrush current limiting implemented according to the present invention.

Referring now to FIG. 3, the basic concept of a synchronous boost converter, generally designated at 50, has the same general architecture as the conventional circuit of FIG. 1 with a diode rectifier bridge 14, a high side MOSFET 16, a boost choke 18 and an output capacitor 22, to which a load circuit 24 is connected in parallel. The boost diode of FIG. 1, however, is replaced by a bidirectional normally on switch 52 of the type described above, and illustrated in FIG. 2. Inrush and synchronous rectification control is provided by a logic unit 54, which may be of any suitable or desired type, or as described in the exemplary embodiments described below, generates the appropriate control signals for switch 52. MOSFET 16 is driven in conventional fashion by suitable pulse width modulation logic (not shown).

A preferred exemplary, but non-limiting implementation employs a Schottky diode 58 connected between the line side gate and source terminals 60 and 62 of bidirectional switch 64. In this implementation, the load side gate 66 is not driven and is therefore connected directly to load side source 68.

Switch 64 needs to be able to block voltage in both directions. In a boost converter, when output capacitor 22 is discharged, the output voltage is lower than the input. However, when the circuit is operating, the output voltage is always larger than the input voltage. Correspondingly, switch 64 needs to be able to conduct current at least in one direction.

This functionality is obtained by use of low voltage Schottky diode 58 which generates the gate signal for turning on switch 64. When MOSFET 16 turns on, the current will be diverted into its drain. As soon as the voltage starts to build up across Schottky diode 58, switch 64 turns off, blocking the output voltage. When MOSFET 16 turns off, the opposite process takes place.

Figure 4:
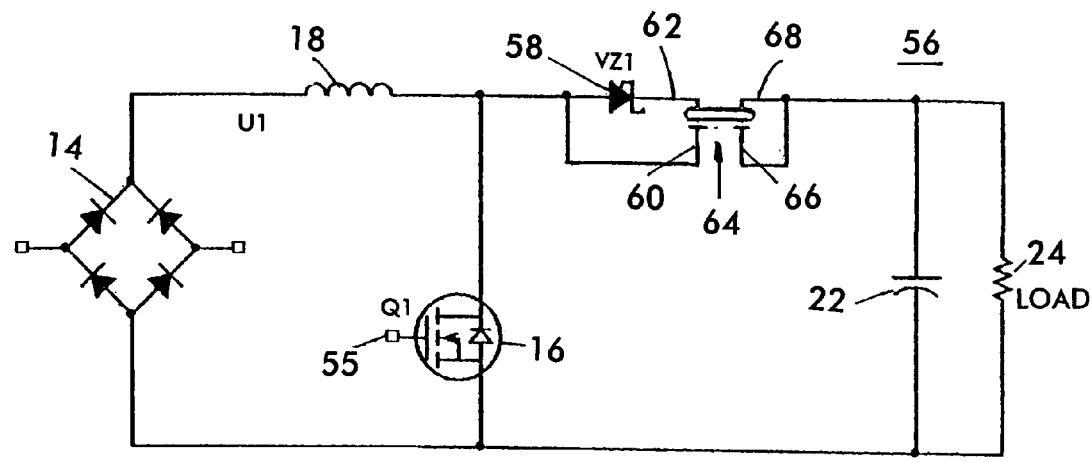
FIG. 4 is a schematic diagram of a self-driven synchronous rectifier boost converter according to the present invention.

As previously noted, in the circuit of FIG. 4, the second gate 66 is not used and does not affect the operation. However, because gate 66 can be used to independently control the operation of switch 64, it can be used to implement inrush current protection, as illustrated in FIG. 5.

Figure 5:
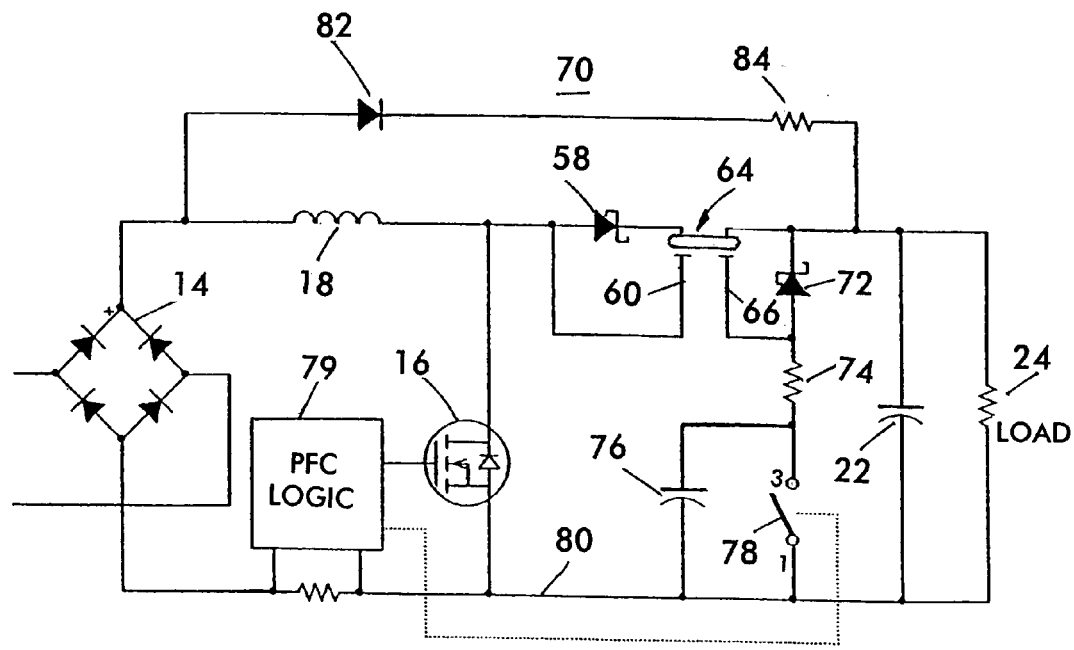
FIG. 5 is a circuit diagram of an implementation of the device of FIG. 4 providing inrush current protection.

The inrush current protection implementation circuit 70 illustrated in FIG. 5 differs from circuit 56 in that a second Schottky diode 72 is provided between the load side gate and drain terminals 66 and 68 of switch 64, and a current path to the low side rail 80 from MOSFET 16 is provided through a series combination of resistor 74 and capacitor 76. In addition, a switch 78 is connected across capacitor 76. This is operated by PFC logic circuit 78 to control the voltage at gate 66. In addition, an inrush diode 82 in series with an inrush resistor 84 may also be provided, as described below.

In operation, at system startup, when the AC line is applied to the system across bridge 14, output capacitor 22 is still discharged. Regardless of the position of switch 78, there will be 0V bias applied to the gate 66 and therefore the switch 68 will be "on".

As current starts flowing thru the inductor 18, diode 58 and switch 68 (assuming inrush diode 82 and resistor 84 not present), voltage will start to build up on the output capacitor 22. With the control switch 78 closed, the same output voltage will be present on the clamp diode 72 and therefore applied to the gate 66 of the switch 68. When the output voltage reaches the threshold voltage of switch 68, the switch will turn off, blocking the charging current path.

When the control switch 78 is open, capacitor 76 will start charging toward the same voltage as on capacitor 22, and gate 66 will track the voltage as capacitor 76 charges. The charging time is determined by the RC time constant of resistor 74 and capacitor 76 and can be made arbitrarily long, to limit inrush current to desired value. Alternatively, switch 78 can be pulse width modulated (PWM) to control the rate of rise of the input current. Inrush diode 82 and inrush resistor 84 can also be used to provide an extra path for charging the output capacitor 22.

Switch 78 can be closed at anytime during operation, to open the current path from input to output. The PFC control will usually monitor the bus current. When the set current limit is reached, switch 78 will be closed, causing a negative bias on gate 66 and opening switch 68.

Although the present invention has been described in relation to particular embodiments thereof, many other variations and modifications and other uses will be apparent to those skilled in the art in light of the description herein. It is intended, therefore, that the invention not be limited by the specific disclosure herein, but that it be given the full scope permitted according to the appended claims.

What is claimed is:

1. A boost converter comprising:
a power output switch;
an output capacitor coupled to the power output switch for connection to a load circuit;
a bidirectional normally on semiconductor switch coupled between the output capacitor and the power output switch;
a Schottky diode connected between a first gate terminal and a first source terminal of the bidirectional switch; and
a direct connection between a second gate terminal and a second source terminal of the bidirectional switch,
whereby the bidirectional switch is self driven, and provides in its conductive state, a current path between the power output switch and the output capacitor through the first and second source terminals.

2. A boost converter according to claim 1, further including control circuitry for the bidirectional switch which implements synchronous rectification and inrush current limiting protection.

3. A boost converter according to claim 1, wherein the first source terminal and the first gate terminal of the bidirectional switch are on a line side of the bidirectional switch, and the second source terminal and the second gate terminal are on a load side of the bidirectional switch.

4. A boost converter according to claim 1, wherein the power output switch is a power MOSFET.

5. A boost converter according to claim 1, wherein the bidirectional switch and other parts of the boost converter are fabricated on a single IC.

6. A self-driven boost converter with inrush current limiting protection comprising:
   a power output transistor
   an output capacitor coupled to the output transistor for connection to a load circuit;
   a bidirectional normally on semiconductor switch coupled between the output capacitor and a first side of a current path for the power output switch;
   a first biasing circuit connected between a first gate terminal and a first source terminal of the bidirectional switch;
   a second biasing circuit connected between a second gate terminal and a second source terminal of the bidirectional switch; and
   a control circuit for controlling the second biasing circuit.

7. A converter according to claim 6, wherein the first biasing circuit is a Schottky diode connected between the first gate terminal and the first source terminal, whereby the bidirectional switch is self driven.

8. A boost converter according to claim 7, wherein the second biasing circuit is comprised of:
   a second Schottky diode connected between the second gate terminal and the second source terminal;
   a series RC circuit connected between the second gate terminal and a second terminal of the current path for the output transistor; and
   a control switch operable to a first state to permit a bias voltage at the second gate terminal to assume a value which turns off the bidirectional switch.

9. A boost converter according to claim 8, wherein the control switch operates in the first state to bypass a capacitor in the series RC circuit.

10. A boost converter according to claim 8, further including a control circuit for the second biasing circuit which is operable in response to a predetermined condition of the load current to place the control switch in the first state.

11. A boost converter according to claim 8, wherein a time constant of the RC circuit is set to determine the maximum permitted inrush current.

12. A boost converter according to claim 6, wherein the second biasing circuit is comprised of:
   a Schottky diode connected between the second gate terminal and the second source terminal;
   a series RC circuit connected between the second gate terminal and a second terminal of the current path for the output transistor; and
   an externally controlled switch operable to a first state which permits a bias voltage at the second gate terminal to assume a value which turns off the bidirectional switch.

13. A boost converter according to claim 12, wherein the control switch operates in the first state to bypass a capacitor in the series RC circuit.

14. A boost converter according to claim 12, further including a control circuit for the second biasing circuit which is operable in response to a predetermined condition of the load current to place the control switch in the first state.

15. A boost converter according to claim 12, wherein a time constant of the RC circuit is set to determine the maximum permitted inrush current.

16. A boost converter according to claim 12, further including a diode in series with a resistor connected between the line and load sides of the bidirectional switch.

17. A boost converter according to claim 12, wherein the externally controlled switch is pulse width modulated to control the rise of the input current.

18. A boost converter according to claim 6, wherein the bidirectional switch and other parts of the boost converter are fabricated on a single IC.

* * * * *